(12) United States Patent
Choi

(10) Patent No.: US 7,791,958 B2
(45) Date of Patent: Sep. 7, 2010

(54) PSEUDO DIFFERENTIAL OUTPUT BUFFER, MEMORY CHIP AND MEMORY SYSTEM

(75) Inventor: Jung-Hwan Choi, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 153 days.

(21) Appl. No.: 12/243,116

(22) Filed: Oct. 1, 2008

(65) Prior Publication Data
US 2009/0021286 A1 Jan. 22, 2009

Related U.S. Application Data

(62) Division of application No. 11/226,263, filed on Sep. 15, 2005, now Pat. No. 7,450,437.

(30) Foreign Application Priority Data
Oct. 18, 2004 (KR) .............................. 2004-83040

(51) Int. Cl.
*G11C 7/10* (2006.01)
(52) U.S. Cl. .................. 365/189.05; 326/68; 326/87; 327/108; 365/191; 365/198
(58) Field of Classification Search .................. 326/68, 326/87; 327/108; 365/189.05, 191, 198
See application file for complete search history.

(56) References Cited

U.S. PATENT DOCUMENTS 5,539,350 A * 7/1996 Wilhelm .................. 327/375
5,731,711 A 3/1998 Gabara
6,204,692 B1 * 3/2001 Nakagawa .................. 326/83
6,252,432 B1 * 6/2001 Freitas .................. 327/65
6,771,097 B1 * 8/2004 Poh Ho et al. .............. 327/108
6,853,213 B2 2/2005 Funaba
6,985,009 B2 * 1/2006 Nishio et al. .................. 326/30
7,102,905 B2 9/2006 Funaba et al.
7,233,201 B2 6/2007 King et al.
2002/0105360 A1 8/2002 Kim et al.

FOREIGN PATENT DOCUMENTS

JP 07-038403 2/1995
KR 1999-0083148 11/1999

* cited by examiner

*Primary Examiner*—Dang T Nguyen
*Assistant Examiner*—Alexander Sofocleous
(74) *Attorney, Agent, or Firm*—Volentine & Whitt, PLLC

(57) ABSTRACT

An output buffer includes first and second input transistors, first and second output loads and a current source. The first and second input transistors have first current electrodes that are commonly coupled to each other and control electrodes that are respectively coupled to a first differential input signal and a second differential input signal. The first and second output loads are coupled between a first power supply voltage and the first and second input transistors, respectively, wherein an output terminal is coupled to a node where the first output load is coupled to the first input transistor. The current source is coupled between the first current electrodes of the first and second input transistors and a second power supply voltage, wherein the second output load has an impedance value substantially one half of an impedance value of the first output load. Therefore, a differential output signal may be outputted through a single output terminal.

2 Claims, 7 Drawing Sheets

PSEUDO DIFFERENTIAL OUTPUT BUFFER, MEMORY CHIP AND MEMORY SYSTEM

CROSS-REFERENCE TO RELATED APPLICATIONS

This application is a divisional application of application Ser. No. 11/226,263 filed on 15 Sep. 2005, which claims priority under 35 USC §119 to Korean Patent Application No. 2004-83040, filed on 18 Oct. 2004, the contents of each of which are herein incorporated by reference in their entirety for all purposes.

BACKGROUND OF THE INVENTION

1. Field of the Invention

The present invention relates to a pseudo differential output buffer, a memory chip and a memory system, and more particularly to an output buffer of a memory chip to drive a data transmission line between a memory module and a memory controller.

2. Description of the Related Art

As computers and networks have increased operating speeds, it is desirable that a memory such as a dynamic random access memory (DRAM) operates at high speed and has a large capacity. In a computer system, a central processing unit (CPU) and a memory are electrically connected to each other via a memory controller. The memory may include a memory module mounted on a motherboard. In that case, the memory controller and the memory module are electrically connected via a transmission line formed in a printed circuit board (PCB). Therefore, the signal attenuation of the transmission line may be increased with an increase of a distance between the memory controller and the memory module.

Methods of driving an output buffer include a push-pull driver method, an open drain driver method, and a differential amplifying driver method. In a DDR type memory module, 64 data lines may be used. Accordingly, a push-pull type output buffer or an open drain type output buffer may be used to account for a number of the data lines. In a Rambus DRAM memory module or a fully buffered dual in-line memory module (FB-DIMM), a differential amplifying method may be used to allow for high-speed operation. The Rambus DRAM DIMM may have 32 data lines for 16 differential pairs of packets. The FB-DIMM memory module may have 14 differential pairs for northbound packets and 10 differential pairs for southbound packets so that the FB-DIMM memory module may include a total of 48 lines.

FIG. 1 is a circuit diagram illustrating a conventional differential driving method of a data bus.

Referring to FIG. 1, a driver 10 and a receiver 20 are coupled via transmission lines 30, a pair of which are allotted to each bit of data. For example, 16 pairs of transmission lines, (32 transmission lines) are needed for 16-bit data. 32 input and output terminals DQ are also needed.

The driver 10 includes input transistors MN1 and MN2 that receive a differential input pair DOUT and DOUTB, respectively, and transistors MP1 and MP2 that are controlled by an output enable signal OEN. The driver 10 further includes output loads Z01 and Z02 that are equal to each other.

The receiver 20 includes termination pull up resistors Z03 and Z04, which are equal to each other and act as termination loads of the transmission line 30, transistors MP3 and MP4 that are controlled by an input enable signal IEN and a data input circuit 22.

FIG. 2 is a waveform diagram illustrating a signal in the data bus in FIG. 1 and FIG. 3 is a circuit diagram illustrating a connection structure of power supply lines of a plurality of data output buffers.

Referring to FIG. 2, in the differential driving method, 16 output buffers may simultaneously operate to drive 16-bit data to allow substantially identical driving currents to continuously flow therethrough. For example, as shown in FIG. 3, each output buffer may consume a driving current Id of about 10 mA, and when a power supply voltage line VDDQ has an impedance Rvddq of about 0.3Ω, a voltage drop ΔV may be generated by Id×16×Rvddq (i.e., 10 mA×16×0.3=48 mV). As a magnitude of the voltage drop ΔV remains constant regardless of an output pattern of the data, simultaneous switching output noise (SSO noise) may not be generated. Therefore, signal integrity may be improved.

However, as two data output terminals are required for one output buffer, the number of data output terminals required is twice the number of data bits. The increase in the number of data output terminals may result in an increase in the chip size and cause difficulty in the layout configuration of the input and output pads.

FIG. 4 is a circuit diagram illustrating a conventional open drain type driving method of a data bus.

Referring to FIG. 4, a driver 40 and a receiver 50 are coupled via a data transmission line 60, a respective one of which is allotted to each corresponding bit of data. For example, 16 transmission lines and 16 output terminals DQ are required for 16-bit data.

The driver 40 includes a transistor MN4 for receiving the input data DOUT and a bias transistor MN5 that are serially coupled between the output terminal DQ and a ground voltage.

The receiver 50 includes a termination pull up resistor Z05 that acts as a termination load of the transmission line 60, a transistor MP5 that operates based on the input enable signal IEN and a data input and output circuit 52.

FIG. 5 is a waveform diagram illustrating a signal in the data bus in FIG. 4.

As shown in FIG. 5, the magnitude of the voltage drop ΔV varies according to the number of output buffers that are turned on.

As the magnitude of the voltage drop ΔV is varied according to a variance in the output pattern of the data, the simultaneous switching output noise (SSO noise) may be generated. Therefore, the signal integrity may be degraded. However, because a respective one output terminal is allotted to each corresponding bit of data, a total number of data output terminals is decreased by one half compared with the differential output method.

Therefore, an output buffer that has an output terminal corresponding to each bit of output data while maintaining the signal integrity substantially equal to the signal integrity of the differential output buffer is needed.

SUMMARY OF THE INVENTION

According one aspect of the invention a pseudo differential output buffer includes first and second input transistors, first and second output loads and a current source. The first and second input transistors have first current electrodes that are commonly coupled to each other together, and control electrodes that are respectively coupled to a first differential input signal and a second differential input signal. The first and second output loads are coupled between a first power supply voltage and the first and second input transistors, respectively, wherein an output terminal is coupled to a node where the first output load is coupled to the first input transistor. The current source is coupled between the first current electrodes of the first and second input transistors and a second power supply voltage, wherein the second output load has an impedance value substantially one half of an impedance value of the first output load.

According to another aspect of the invention, a memory device includes a memory cell array, a row address decoder, a column address decoder, at least one pseudo differential data output buffer, and at least one data input buffer. The row address decoder selects a particular row of the memory cell array to be accessed based on an address signal externally provided. The column address decoder selects a particular column of the memory cell array to be accessed based on the address signal externally provided. The at least one pseudo differential data output buffer outputs data read from the selected memory cell to a data input and output terminal. The at least one data input buffer writes data received on the data input and output terminal into the memory cell array.

The pseudo differential data output buffer may include first and second input transistors commonly coupled in a first current electrode to receive a differential input signal; first and second output loads coupled between a first power supply voltage and the first and second input transistors, respectively, wherein the data input and output terminal is coupled to a node where the first output load is coupled to the first input transistor; and a current source coupled between the common first current electrode of the first and second input transistors and a second power supply voltage, wherein the second output load has an impedance value substantially one half of an impedance value of the first output load.

According to still another aspect of the invention, a memory system includes at least one memory module, a host memory controller, and a plurality of data transmission lines. The at least one memory module includes at least one memory chip having the pseudo differential data output buffer. Each of the data transmission lines electrically couples the host memory controller to the memory module to transmit a differentially amplified signal, wherein each bit of data is communicated between the host memory controller and the memory module using a single one of the data transmission lines.

BRIEF DESCRIPTION OF THE DRAWINGS

The present invention will become more apparent to those of ordinary skill in the art by describing, in detail, example embodiments thereof with reference to the attached drawings, wherein like elements are represented by like reference numerals, which are given by way of illustration only and thus do not limit the example embodiments of the present invention.

DESCRIPTION OF THE EXAMPLE EMBODIMENTS

Hereinafter, the present invention will be explained in detail with reference to the accompanying drawings.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 6:
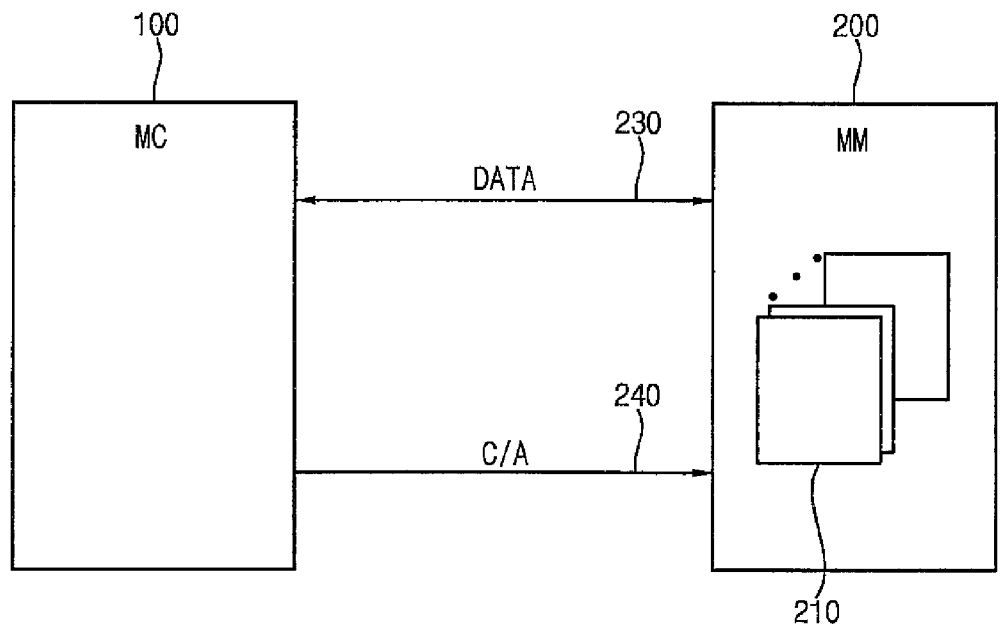
FIG. 6 is a block diagram illustrating a memory system including a memory chip that employs a pseudo differential output buffer.

FIG. 6 is a block diagram illustrating a memory system including a memory chip that employs a pseudo differential output buffer.

Referring to FIG. 6, the memory system includes a host memory controller MC 100 and a memory module MM 200 that are coupled via a data bus DATA 230 and an address and control bus C/A 240.

Data bus DATA 230 includes transmission lines, a respective one of which is allotted for each corresponding bit of data. Namely, when the data has 64 bits, data bus DATA 230 includes 64 transmission lines corresponding to each of the 64 bits of the data. Memory module MM 200 includes a plurality of memory chips 210. For example, for 8-bit data memory module 200 may include 8 memory chips 210 each having 8 output terminals DQ. Therefore, memory module 200 may have a total of 64 data output terminals DQ to provide data outputted from respective memory chips 210 therethrough.

Figure 7:
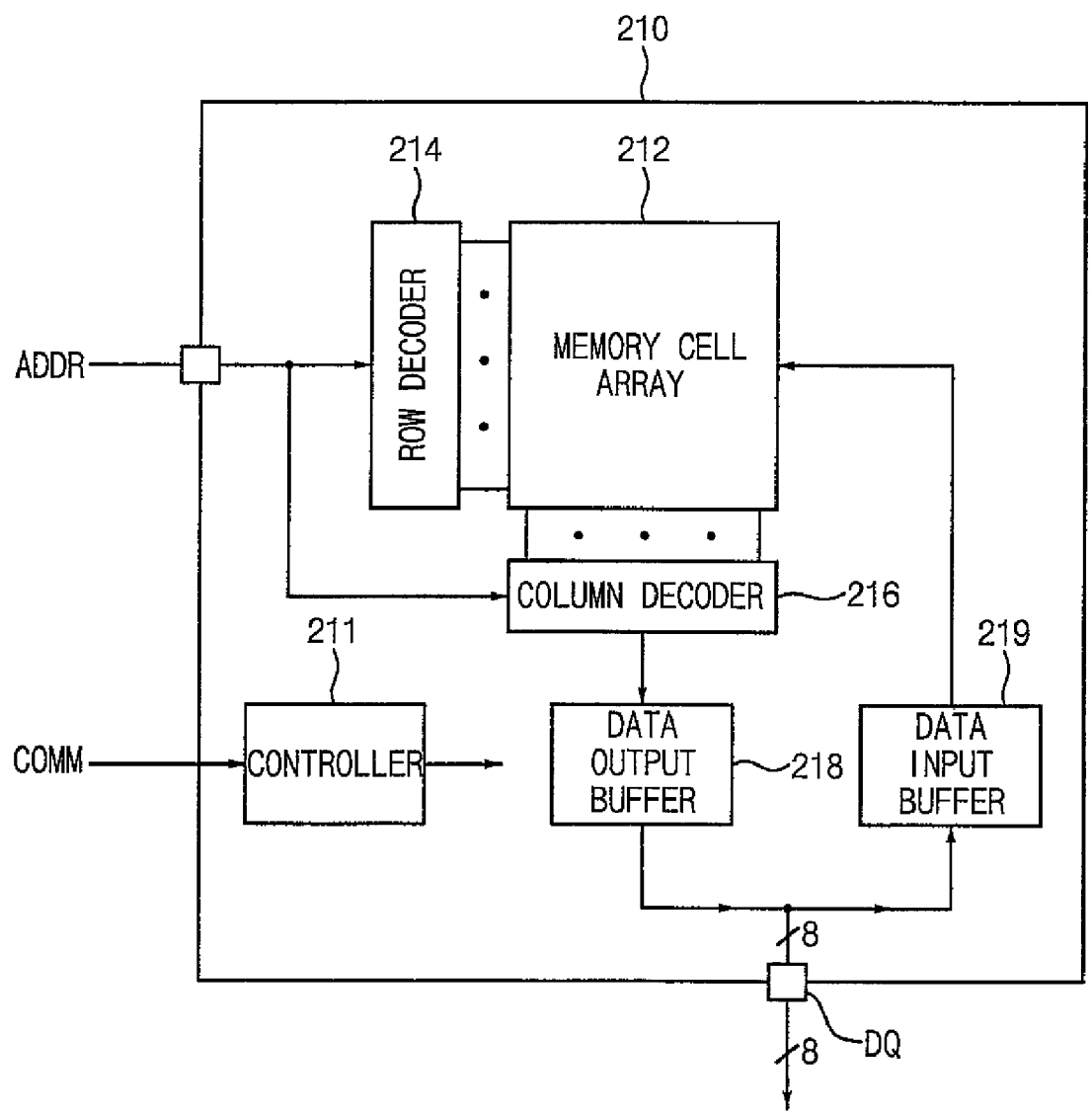
FIG. 7 is a block diagram illustrating a memory chip that may be used in the memory system of FIG. 6.

FIG. 7 is a block diagram illustrating one embodiment of the memory chip 210 that may be used in the memory system of FIG. 6.

Referring to FIG. 7, memory chip 210 includes a controller 211, a memory cell array 212, a row address decoder 214, a column address decoder 216, one or more pseudo differential data output buffers 218, and a data input buffer 219.

Controller 211 generates an internal control signal based on a command signal COMM externally provided.

Row address decoder 214 receives an address signal ADDR externally provided to select a particular row of memory cell array 212. Column address decoder 216 receives the address signal ADDR externally provided to select a particular column of memory cell array 212. Pseudo differential data output buffers 218—as many as the number of data output terminals DQ of the memory module 210—are included and disposed at each data output terminal. Pseudo differential data output buffers 218 output n-bit data, e.g., 8-bit data, which is read from a memory cell selected by the address signal ADDR, to be outputted to eight data input and output terminals DQ.

Figure 8:
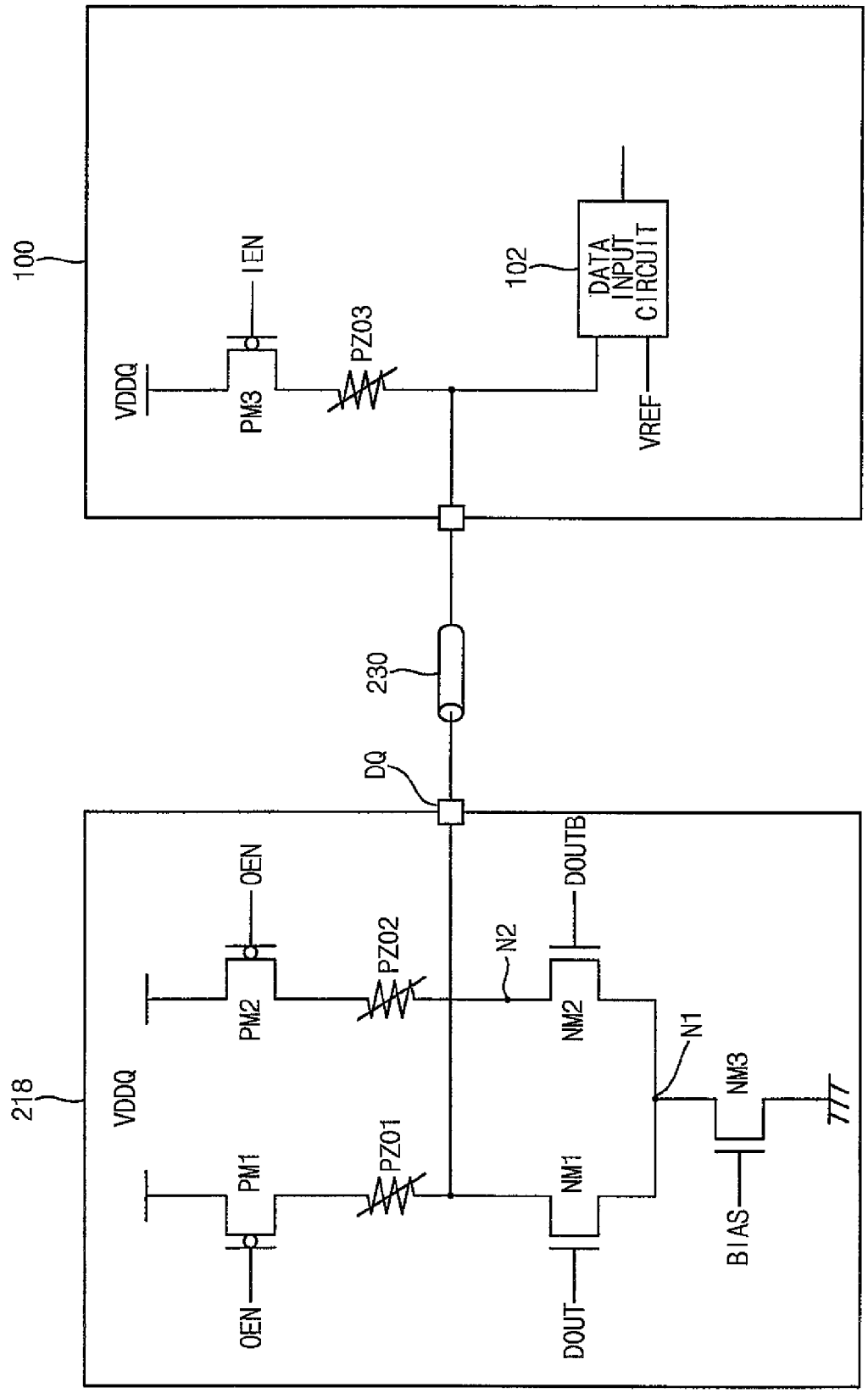
FIG. 8 is a circuit diagram illustrating a data output buffer that may be used in the memory chip of FIG. 7.

FIG. 8 is a circuit diagram illustrating one embodiment of a pseudo differential data output buffer that may be used in memory chip 210 of FIG. 7, and its connection to memory controller 100.

Referring to FIG. 8, pseudo differential data output buffer 218 includes transistors NM1 and NM2 for receiving differential input signals DOUT and DOUTB, a bias transistor NM3, output loads PZO1 and PZO2, and transistors PM1 and PM2 that operate based on the output enable signal OEN.

Transistor NM1 has a gate electrode for receiving the differential input signal DOUT, a source electrode coupled to a node N1 and a drain electrode coupled to output terminal DQ. Transistor NM2 has a gate electrode for receiving the differential input DOUTB, a source electrode coupled to node N1 and a drain electrode coupled to a node N2. Bias transistor NM3 has a gate electrode for receiving a bias signal BIAS, a source electrode coupled to a ground voltage and a drain electrode coupled to node N1. Transistor PM1 has a gate electrode for receiving the output enable signal OEN, a source electrode coupled to the supply voltage VDDQ and a drain electrode coupled to the output terminal DQ through output load PZO1. Transistor PM2 has a gate electrode for receiving the output enable signal OEN, a source electrode coupled to the supply voltage VDDQ, and a drain electrode coupled to node N2 through output load PZO2.

According to an exemplary embodiment, an inversion node of pseudo differential data output buffer 218 is used as the output terminal DQ and a non-inversion node N2 is not connected to an exterior of data output buffer 218. In addition, beneficially, output load PZO2 has an impedance value corresponding to one half of an impedance value of the output load PZO1.

A receiving end of memory controller 100 that is coupled to pseudo differential data output buffer 218 through transmission line 230 may be constructed in an open drain type manner. As shown in FIG. 8, memory controller receiver includes a termination pull-up resistor PZ03 that is a termination load of transmission line 230, a transistor PM3 that operates based on an input enable signal IEN, and a data input circuit 102. Termination pull up resistor PZ03 may have an impedance value substantially the same as output load PZ01.

In the strictest sense, it may be desirable that a total sum of respective impedances of output terminal DQ of output buffer 218, transmission line 230, input terminal DQ of receiver of memory controller 100, and termination pull up resistor PZ03 is adjusted to be substantially equal to the impedance of output load PZ01 of the output buffer 218.

Therefore, when output buffer 218 is enabled, the composite load resistance at the output terminal DQ is the parallel resistance of output load PZ01 and termination pull up resistor PZ03 of the memory controller 100, which are coupled in parallel.

When the resistance of termination pull up resistor PZ03 is substantially the same as the resistance of output load PZ01, the composite load resistance is one half of the resistance of output load PZ01. In that case, when output load PZ02 has an impedance value corresponding to one half of an impedance value of the output load PZ01, as mentioned earlier, then the composite load resistance at the output terminal DQ may be substantially equal to the resistance of output load PZ02. Namely, when pseudo differential output buffer 218 is activated, respective output loads of the two branches may be maintained substantially equal to each other so as to function like a differential amplifier.

Figure 9:
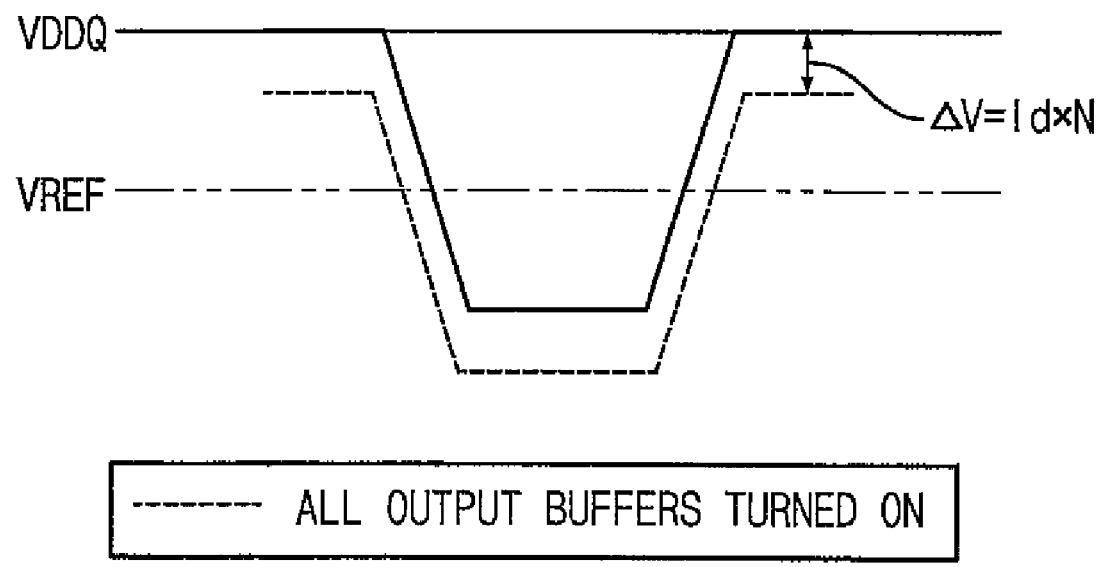
FIG. 9 is a waveform diagram illustrating a signal in the data output buffer in FIG. 7.

FIG. 9 is a waveform diagram illustrating a signal in the data bus in FIG. 8.

Figure 1:
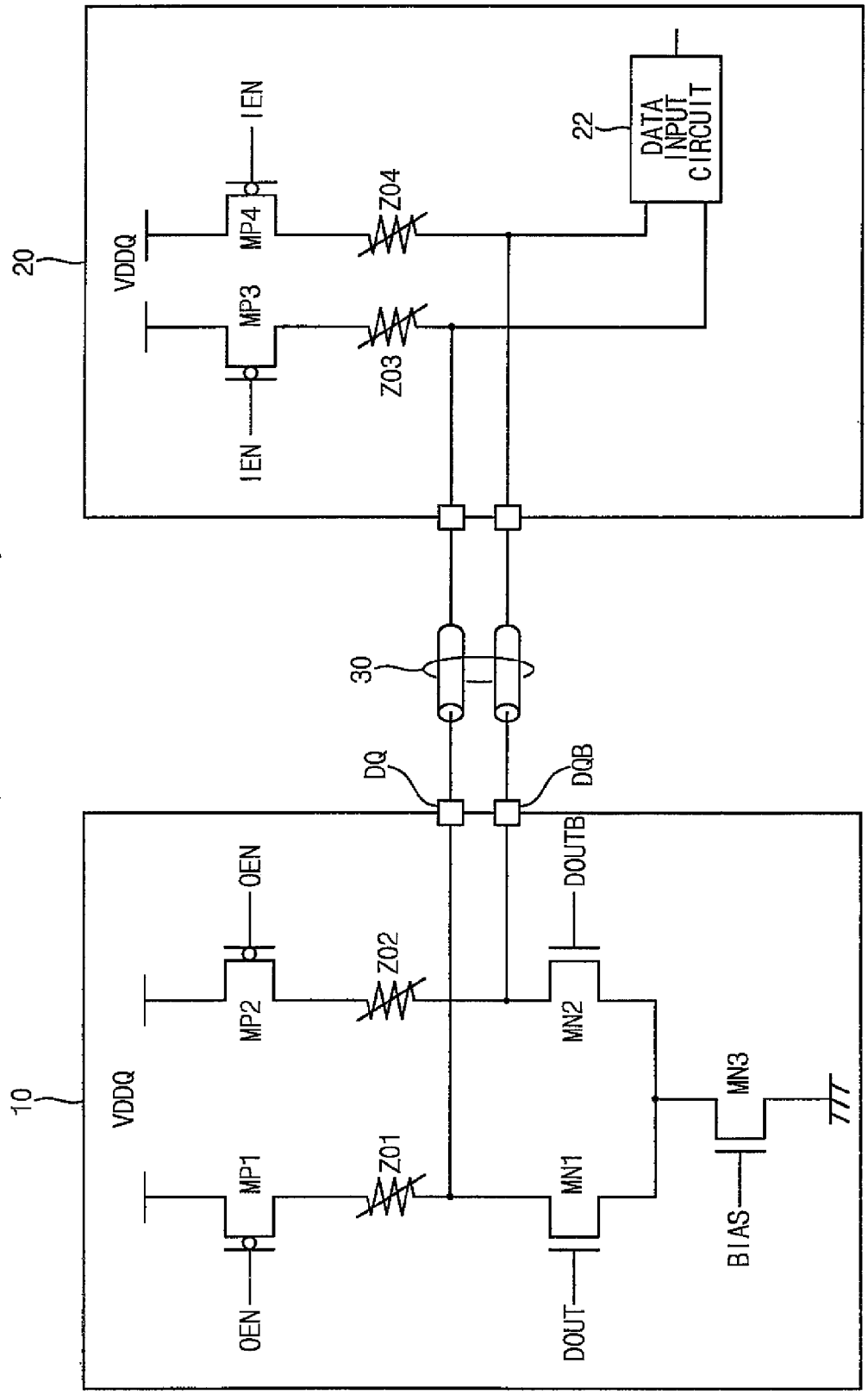
FIG. 1 is a circuit diagram illustrating a conventional differential driving method of a data bus.
Figure 2:
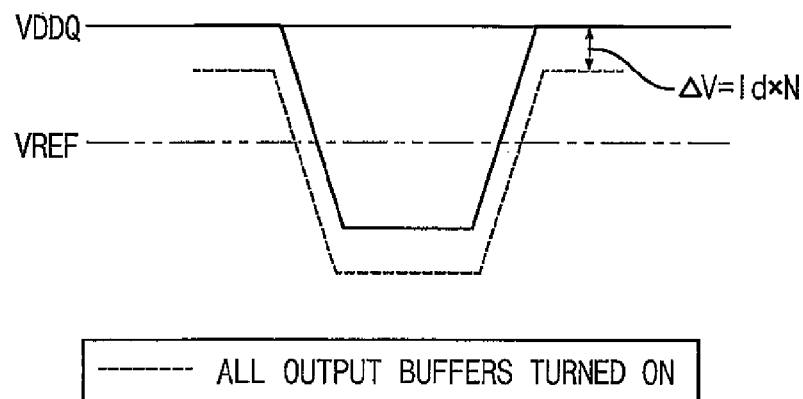
FIG. 2 is a waveform diagram illustrating a signal in the data bus in FIG. 1 that is being driven.
Figure 3:
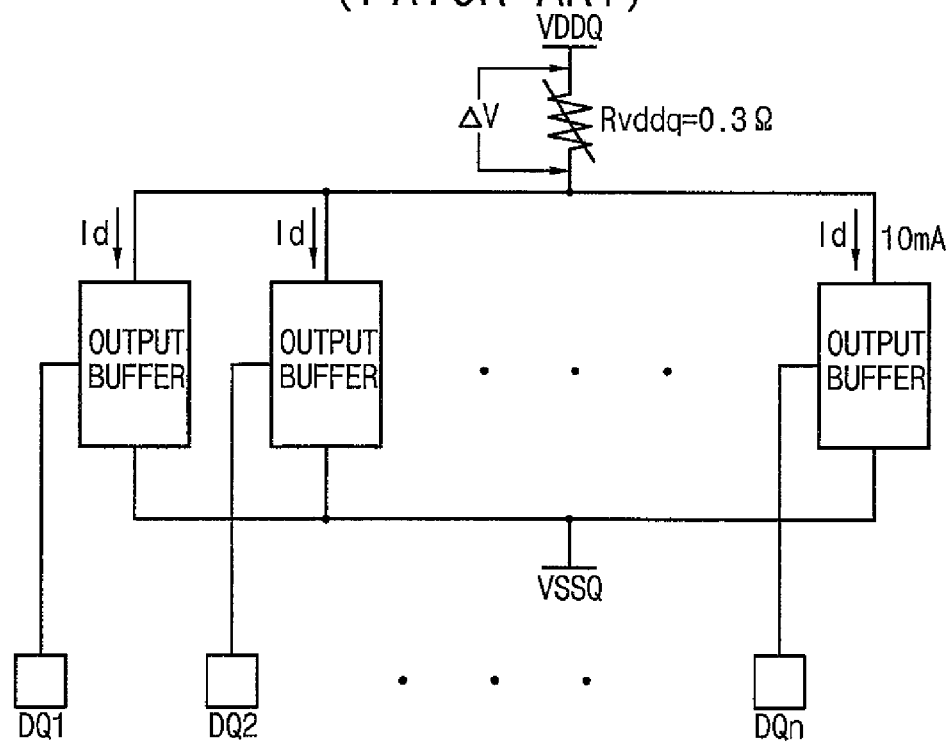
FIG. 3 is a circuit diagram illustrating a connection structure of power supply lines of a plurality of data output buffers.
Figure 4:
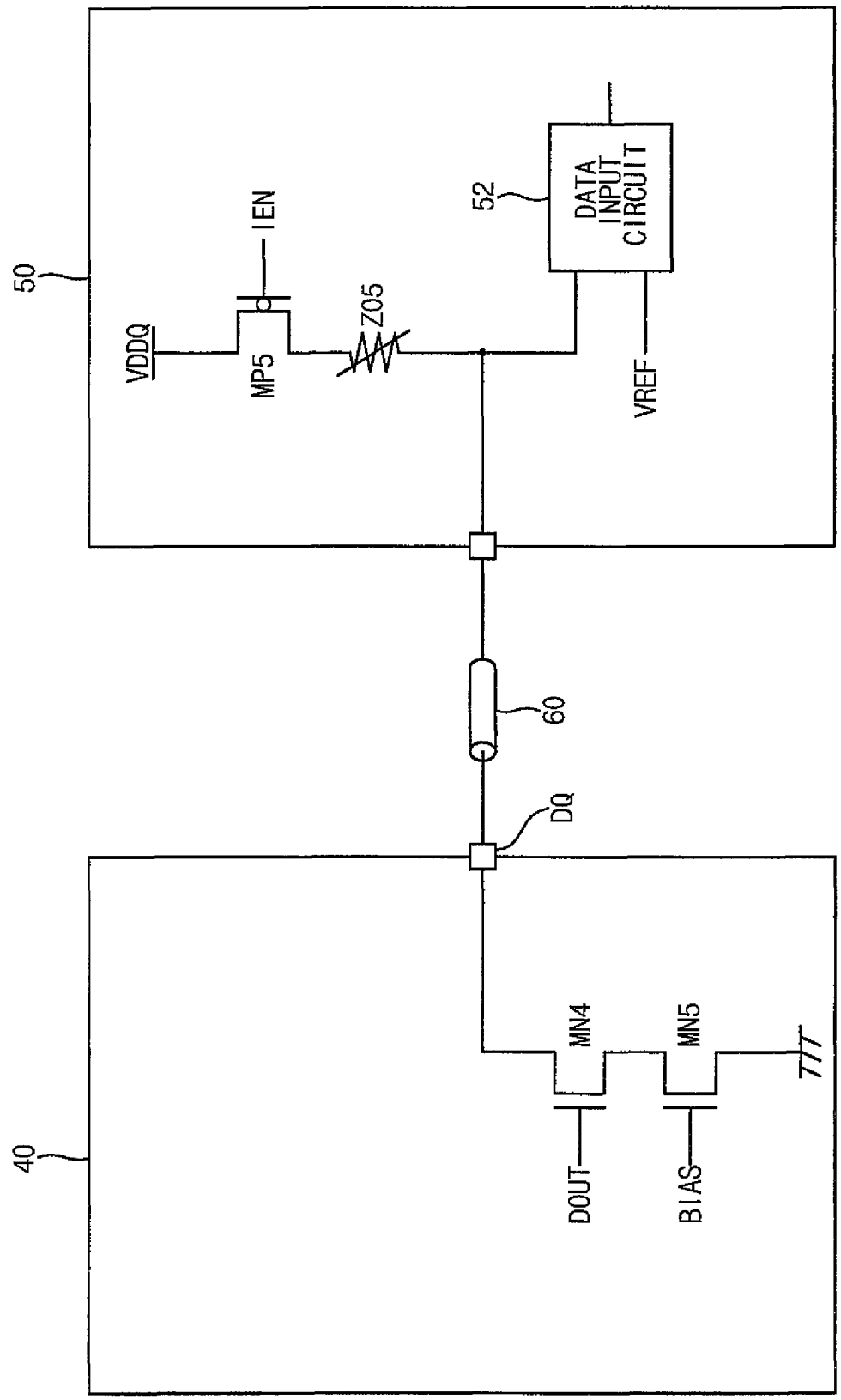
FIG. 4 is a circuit diagram illustrating a conventional open drain type driving method of a data bus.
Figure 5:
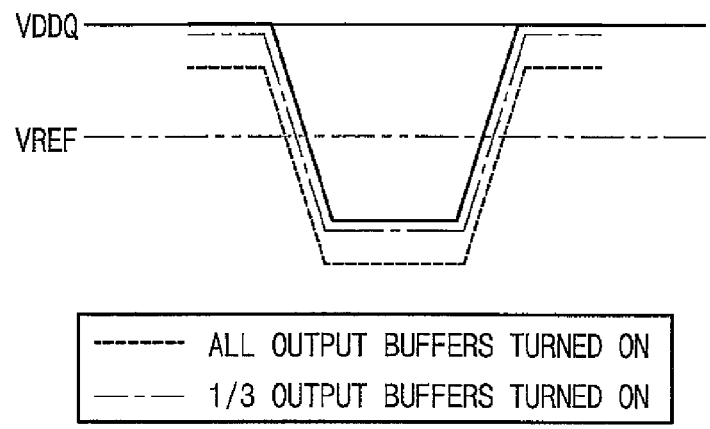
FIG. 5 is a waveform diagram illustrating a signal in the data bus in FIG. 4 that is being driven.

As shown in FIG. 9, when pseudo differential output buffer 218 of FIG. 8 is used, a voltage drop ΔV constantly remains substantially the same, similar to the signal shown in FIG. 2 generated by the differential driving method. Therefore, the SSO noise may not be generated and each output terminal may correspond to a single data bit.

According to an example embodiment as described above, when data having a number of bits are outputted in parallel through output terminals, each bit of the data may be outputted through a corresponding data transmission line (i.e., data output pin). Namely, a respective one of the data transmission lines is allotted for each corresponding bit of data, while the output terminals are differentially driven. Therefore, the increase in chip size due to the number of output terminals may be prevented and the signal integrity level may be maintained substantially the same as that of the differential output buffer.

Having thus described example embodiments of the present invention, it is to be understood that the invention defined by the appended claims is not to be limited by particular details set forth in the above description as many apparent variations thereof are possible without departing from the spirit or scope thereof as hereinafter claimed.

What is claimed:

1. An output buffer comprising:
   first and second input transistors, first current electrodes of the first and second input transistors being commonly coupled together, and control electrodes of the first and second input transistors respectively being coupled to a first differential input signal and a second differential input signal;
   first and second output loads coupled between a first power supply voltage and the first and second input transistors, respectively, wherein an output terminal is coupled to a node where the first output load is coupled to the first input transistor; and
   a current source coupled between the first current electrodes of the first and second input transistors and a second power supply voltage,
   wherein the second output load has an impedance value substantially one half of an impedance value of the first output load.

2. The output buffer of claim 1, further comprising first and second switching units coupled between the first power supply voltage and the first and second output loads, respectively, the first and second switching units being switched in response to an output enable signal.

* * * * *